(12) United States Patent
Stolpman

(10) Patent No.: US 7,934,146 B2
(45) Date of Patent: Apr. 26, 2011

(54) METHOD, APPARATUS AND COMPUTER PROGRAM PRODUCT PROVIDING FOR DATA BLOCK ENCODING AND DECODING

(75) Inventor: Victor Stolpman, Dallas, TX (US)

(73) Assignee: Nokia Corporation, Espoo (FI)

( * ) Notice: Subject to any disclaimer, the term of this patent is extended or adjusted under 35 U.S.C. 154(b) by 1223 days.

(21) Appl. No.: 11/583,222

(22) Filed: Oct. 18, 2006

(65) Prior Publication Data
US 2008/0109699 A1 May 8, 2008

(51) Int. Cl.
*G06F 11/00* (2006.01)
*H03M 13/00* (2006.01)
(52) U.S. Cl. ...................................................... 714/800
(58) Field of Classification Search .................. 714/759, 714/786, 800–801
See application file for complete search history.

(56) References Cited

U.S. PATENT DOCUMENTS

| | | | |
|---|---|---|---|
| 7,222,284 B2 | 5/2007 | Stolpman | 714/758 |
| 7,430,396 B2 * | 9/2008 | Sun et al. | 455/3.01 |
| 7,458,010 B2 | 11/2008 | Stolpman | 714/752 |
| 7,493,548 B2 * | 2/2009 | Nimbalker et al. | 714/758 |
| 7,581,157 B2 * | 8/2009 | Oh et al. | 714/781 |
| 7,594,154 B2 | 9/2009 | Vedantham et al. | 714/752 |

OTHER PUBLICATIONS

Nana et al., Improved decoding of LDPC coded modulations, May 2006, IEEE Comm. letters, vol. 10, No. 5, p. 375-377.*
Draft Amendment to Standard, Information Technology-Telecommunications and Information Exchange Between Systems-Local and Metropolitan Networks-Specific Requirements-Part 11: Wireless LAN Medium Access Control (MAC) and Physical Layer (PHY) Specifications: Amendment #: Enhancements for Higher Throughput., Mar. 2006 IEEE P802.11n/D0.04.
Draft Amendment to Standard, Information Technology-Telecommunications and Information Exchange Between Systems-Local and Metropolitan Area Networks-Specific Requirements-Part 11: Wireless LAN Medium Access Control (MAC) and Physical Layer (PHY) Specifications: Amendment #: Enhancements for Higher Throughput, Sep. 2006 IEEE P802.11n/D1.04.
R. G. Gallager, "Low Density Parity-Check Codes", MIT Press, Cambridge, Mass., 1963.
Victor Stolpman, E-mail Submission to IEEE, Oct. 19, 2005.

* cited by examiner

*Primary Examiner* — Shelly A Chase
(74) *Attorney, Agent, or Firm* — Harrington & Smith

(57) ABSTRACT

Methods, apparatus and computer program products are provided for encoding and/or decoding a data block. The method for encoding a data block includes the steps of: providing an information block of size k, $I=(i_0, i_1, \ldots i_{(k-1)})$; and encoding the information block into a low-density parity-check (LDPC) codeword c of size n, $c=(i_0, i_1, \ldots i_{(k-1)}, p_0, p_1, \ldots, p_{(n-k-1)})$, by adding n–k parity bits obtained so that $H \cdot c^T = 0$, where H is an (n–k)×n parity-check matrix.

55 Claims, 7 Drawing Sheets

```
N=648, Z=27
22  3 25  6  3 13 11 10 -- 21 -- 13 -- 2 -- 22 -- 5  1  0 -- -- -- -- -- -- --
 8 13 23  2  7 15  4 -- 17 --  6 -- 1 --  1 -- 7 -- -- 0  0 -- 0  0 -- -- -- --
11  5 17 19 17  3 12  9 -- -- --  5 -- 8 -- 10 -- -- 1 -- -- 0  0 -- -- 0 -- --
19 15  2  7  1 19 13 -- --  4 --  6 -- 13 -- 24 -- 6 -- -- 0 -- -- 0  0 -- -- --
25 22 25  8 21 10 24  3 --  -- --  2 -- 9 --  8 -- -- 6 -- -- -- 0 -- --  0  0 --
14 25  6 23 15 16  7 -- 24 --  5 -- 16 -- 6 --  2 -- -- -- -- 1 -- -- -- -- -- 0
                                                                         ⋮  ⋮

EbNodB = [2     2.25      2.5       2.75      3         3.25      3.5
BLER   = [0.6772 0.43988  0.22745   0.084483  0.027199  0.0061389 0.0012455

EbNodB = ...    3.75      4         4.25]
BLER   = ...    0.000262  5.5e−005  1.6e−005]
```

EbNodB = [2        2.25     2.5      2.75     3        3.25
BLER = [0.72254  0.40355  0.13654  0.02805  0.0031905  0.00026667

EbNodB = ...    3.5          3.75]
BLER = ...    4.1667e-005  6.6667e-006]

EbNodB = [2      2.25       2.5        2.75     3           3.25]
BLER  = [0.75472 0.35855    0.079485   0.0086   0.00049825  2.4e-005]

METHOD, APPARATUS AND COMPUTER PROGRAM PRODUCT PROVIDING FOR DATA BLOCK ENCODING AND DECODING

TECHNICAL FIELD

The exemplary embodiments of this invention relate generally to wireless communication systems, methods, devices and computer program products, and relate further to the encoding and decoding of data blocks, such as those sent through a packet communication channel.

BACKGROUND

Abbreviations found in the patent application are defined as follows:
AGWN additive white Gaussian noise
BER bit error rate
BLER block error rate
LDPC low-density parity-check
LDPCC low-density parity-check code
FEC forward error correction
IP internet protocol
TCP transport control protocol
TGn task group "n"
WLAN wireless local area network When a transmitting end transmits data packets to a receiving end via a packet switched communication network, for instance via the Internet or an IP based wireless network, some of the data packets may be corrupted or lost on the way. It is therefore common practice to transmit in addition error correction data to the receiving end. The error correction data may enable the receiving end to restore corrupted or lost data to a considerable extent.

In order to minimize the amount of data which has to be transmitted, the error correction data may be transmitted, for example, only in case the receiving end does not acknowledge safe reception of a transmitted data packet. However, using an acknowledgement protocol is generally not feasible for point-to-multipoint transmissions. For ensuring a reliable transmission in a multicast transmission, conventionally a FEC scheme is implemented. Such a FEC scheme includes sending by default a certain amount of redundant data, which can assist a receiving end in reconstructing erroneous or missing data.

For producing the redundant data for a FEC scheme, various types of coding can be employed. The LDPC family is a class of FEC codes which result in encoded data that can be decoded efficiently using a message-passing algorithm over a graph. When used for erasure correction, the application of a message-passing algorithm is equivalent to solving a set of linear equations by recursive substitution. This type of decoding is also referred to as a chain reaction decoding.

A parity-check matrix which is associated to the employed code uniquely determines the decoding graph or the set of linear equations which have to be solved. The parity-check matrix of binary LDPC has been dealt with, for example, in the document: "Low Density Parity-Check Codes", MIT Press, Cambridge, Mass., 1963, by R. G. Gallager, to which reference may be made.

There exist many types of LDPC codes that result in different decoding performances, depending on the dimensions of the LDPC parity-check matrix and the degree distribution of the associated graph. Some common codes include, for example, regular LDPCs, irregular LDPCs, Low Density Generator Matrix (LDGM) codes, Luby Transform (LT) codes and Raptor codes. Further, the dimensions of a LDPC parity-check matrix may be pre-determined or may be changed on the fly as new output symbols are generated, such as in the case of LT codes and Raptor codes. Two or more LDPC codes may also be cascaded for various reasons that include, but are not limited to, better decoding performance, lower complexity and ease of encoding.

In all cases, the receiving end must know the particular parity-check matrix of each constituent code for setting up the correct graph for message-passing decoding. The parity-check matrix has thus to be signaled to, or otherwise made known to, the receiving end. The LDPC codes are particularly efficient when they are adapted to encode large blocks of data. For example, the block length may typically be a few thousand data symbols. Accordingly, the number of elements in the parity-check matrix can become very large, typically a few million.

LDPC codes can have error correcting capabilities that rival the performance of "Turbo-Codes" and can be applicable over a wide range of statistical channels. In fact, some random irregular LDPC constructions based upon edge ensemble designs have error correcting capabilities measured in BER that are within 0.05 dB of the rate-distorted Shannon limit. Unfortunately, these LPDC code constructions often require long codeword constructions (on the order of $10^6$ to $10^7$ bits) in order to achieve these error rates. Despite good BER performance, these random code constructions often have poor BLER performances. Therefore, these random constructions typically do not lend themselves well to packet-based communication systems.

Another disadvantage of random constructions based on edge distribution ensembles is that, for each codeword length, a separate random construction is needed. Thus, communication systems employing variable block sizes (TCP/IP systems, for example) require multiple code definitions. Such multiple code definitions can consume a significant amount of non-volatile memory for large combinations of codeword lengths and code rates.

As an alternative to random LDPC constructions, structured LDPC constructions typically rely on a general algorithmic approach to constructing LDPC matrices which often requires much less non-volatile memory than random constructions. One such structured approach is based upon array codes. This approach can exhibit improved error performance (both BER and BLER performance) and a relatively low error floor for relatively high code rates (higher than 0.85).

The parity-check matrix H measures (N−K)×N, wherein N is number of elements in a codeword and K is the number of information elements in the codeword. The matrix H is also termed the LDPC mother code. For the specific example of a binary alphabet, N is the number of bits in the codeword and K is the number of information bits contained in the codeword for transmission over a wireless or a wired communication network or system. The number of information elements is therefore less than the number of codeword elements, so K<N. The coding rate R for a LDPC code is R=K/(N−P), wherein P is the number of punctured elements.

SUMMARY

In an exemplary aspect of the invention, a method is provided. The method includes the steps of: providing an information block of size k, $I=(i_0, i_1, \ldots i_{(k-1)})$; and encoding the information block into a low-density parity-check (LDPC) codeword c of size n, $c=(i_0, i_1, \ldots i_{(k-1)}, p_0, p_1, \ldots, p_{(n-k-1)})$, by adding n−k parity bits obtained so that $H \cdot c^T = 0$, where H is an (n−k)×n parity-check matrix.

In another exemplary aspect of the invention, a computer program product is provided. The computer program product includes program instructions embodied on a tangible computer-readable medium. Execution of the program instructions results in operations including: providing an information block of size k, $I=(i_0, i_1, \ldots i_{(k-1)})$; and encoding the information block into a low-density parity-check (LDPC) codeword c of size n, $c=(i_0, i_1, \ldots i_{(k-1)}, p_0, p_1, \ldots, p_{(n-k-1)})$, by adding n–k parity bits obtained so that $H \cdot c^T = 0$, where H is an (n–k)×n parity-check matrix.

In a further exemplary aspect of the invention, a method is provided. The method includes: providing a base matrix having a plurality of shift values and at least one null sub-matrix indicator; and generating a parity-check matrix for a low-density parity-check (LDPC) code. Each shift value of the plurality of shift values represents a cyclic-permutation sub-matrix $P_i$ having a shift value of i, and each cyclic-permutation sub-matrix $P_i$ is obtained from a given permutation sub-matrix of size Z×Z (e.g. a Z×Z identity matrix) by cyclically shifting the columns of the given permutation sub-matrix to the right by a shift value of i elements. The at least one null sub-matrix indicator represents a null sub-matrix. The parity-check matrix is partitioned into square sub-matrices of size Z×Z, and the sub-matrices are one of a cyclic-permutation sub-matrix $P_i$ of the given sub-matrix or a null sub-matrix. Each shift value of the plurality of shift values and the at least one null sub-matrix indicator of the base matrix correspond to a different sub-matrix of the generated parity-check matrix. The following is an example 6×24 base matrix specifying a rate ¾ LDPC structured code (where Z=54 and the corresponding length of the LDPC code is N=1296)

| 39 | 40 | 51 | 41 | 3  | 29 | 8  | 36 | -- | 14 | -- | 6  | -- | 33 | -- | 11 | -- | 4  | 1  | 0  | -- | -- | -- | -- |
|----|----|----|----|----|----|----|----|----|----|----|----|----|----|----|----|----|----|----|----|----|----|----|----|
| 48 | 21 | 47 | 9  | 48 | 35 | 51 | -- | 38 | -- | 28 | -- | 34 | -- | 50 | -- | 50 | -- | -- | 0  | 0  | -- | -- | -- |
| 30 | 39 | 28 | 42 | 50 | 39 | 5  | 17 | -- | 6  | -- | 18 | -- | 20 | -- | 15 | -- | 40 | -- | -- | 0  | 0  | -- | -- |
| 29 | 0  | 1  | 43 | 36 | 30 | 47 | -- | 49 | -- | 47 | -- | 3  | -- | 35 | -- | 34 | -- | 0  | -- | -- | 0  | 0  | -- |
| 1  | 32 | 11 | 23 | 10 | 44 | 12 | 7  | -- | 48 | -- | 4  | -- | 9  | -- | 17 | -- | 16 | -- | -- | -- | -- | 0  | 0  |
| 13 | 7  | 15 | 47 | 23 | 16 | 47 | -- | 43 | -- | 29 | -- | 52 | -- | 2  | -- | 53 | -- | 1  | -- | -- | -- | -- | 0  |

Each number i of the base matrix represents a cyclic-permutation sub-matrix of the parity-check matrix having a shift value of i, with a sub-matrix of shift value 0 representing the Z×Z identity matrix, and a sub-matrix of shift value— representing a null sub-matrix of the parity-check matrix.

In another exemplary aspect of the invention, an apparatus is provided. The apparatus includes: means for providing an information block (I) of size k, where $I=(i_0, i_1, \ldots i_{(k-1)})$; and means for encoding the information block into a low-density parity-check (LDPC) codeword c of size n, where $c=(i_0, i_1, \ldots i_{(k-1)}, p_0, p_1, \ldots, p_{(n-k-1)})$, by adding n–k parity bits obtained so that $H \cdot c^T = 0$, where H is an (n–k)×n parity-check matrix.

In a further exemplary aspect of the invention, an electronic device is provided. The electronic device includes: at least one data processor; at least one memory coupled to the at least one data processor; and an encoder coupled to the at least one data processor, wherein the encoder has an input to receive an information block (I) of size k as an input, where $I=(i_0, i_1, \ldots i_{(k-1)})$, and wherein the encoder is adapted to encode the information block into a low-density parity-check (LDPC) codeword c of size n, where $c=(i_0, i_1, \ldots i_{(k-1)}, p_0, p_1, \ldots, p_{(n-k-1)})$, by adding n–k parity bits obtained so that $H \cdot c^T = 0$, where H is an (n–k)×n parity-check matrix.

In another exemplary aspect of the invention, an electronic device is provided. The electronic device includes: at least one data processor; at least one memory coupled to the at least one data processor; and a decoder coupled to the at least one data processor, wherein the decoder has an input to receive a low-density parity-check (LDPC) codeword c of size n, where $c=(i_0, i_1, \ldots i_{(k-1)}, p_0, p_1, \ldots, p_{(n-k-1)})$, and wherein the decoder is adapted to decode the LDPC codeword to obtain an information block (I) of size k, where $I=(i_0, i_1, \ldots i_{(k-1)})$, by utilizing an (n–k)×n parity-check matrix H, where $H \cdot c^T = 0$.

In a further exemplary aspect of the invention, a circuit is provided. The circuit includes: an input operable to receive an information block (I) of size k, where $I=(i_0, i_1, \ldots i_{(k-1)})$; and circuitry to encode the information block into a low-density parity-check (LDPC) codeword c of size n, where $c=(i_0, i_1, \ldots i_{(k-1)}, p_0, p_1, \ldots, p_{(n-k-1)})$, by adding n–k parity bits obtained so that $H \cdot c^T = 0$, where H is an (n–k)×n parity-check matrix.

In another exemplary aspect of the invention, a circuit is provided. The circuit includes: an input operable to receive a low-density parity-check (LDPC) codeword c of size n, where $c=(i_0, i_1, \ldots i_{(k-1)}, p_0, p_1, \ldots, p_{(n-k-1)})$; and circuitry to decode the LDPC codeword into an information block (I) of size k, where $I=(i_0, i_1, \ldots i_{(k-1)})$, by utilizing an (n–k)×n parity-check matrix H, where $H \cdot c^T = 0$.

BRIEF DESCRIPTION OF THE DRAWINGS

The foregoing and other aspects of embodiments of this invention are made more evident in the following Detailed Description, when read in conjunction with the attached Drawing Figures, wherein:

FIG. 3 represents an exemplary parity-check matrix for a block length of 648 bits in accordance with the exemplary embodiments of the present invention;

FIG. 4 represents an exemplary parity-check matrix for a block length of 1296 bits in accordance with the exemplary embodiments of the present invention;

FIG. 5 represents an exemplary parity-check matrix for a block length of 1944 bits in accordance with the exemplary embodiments of the present invention;

DETAILED DESCRIPTION

Figure 1A:
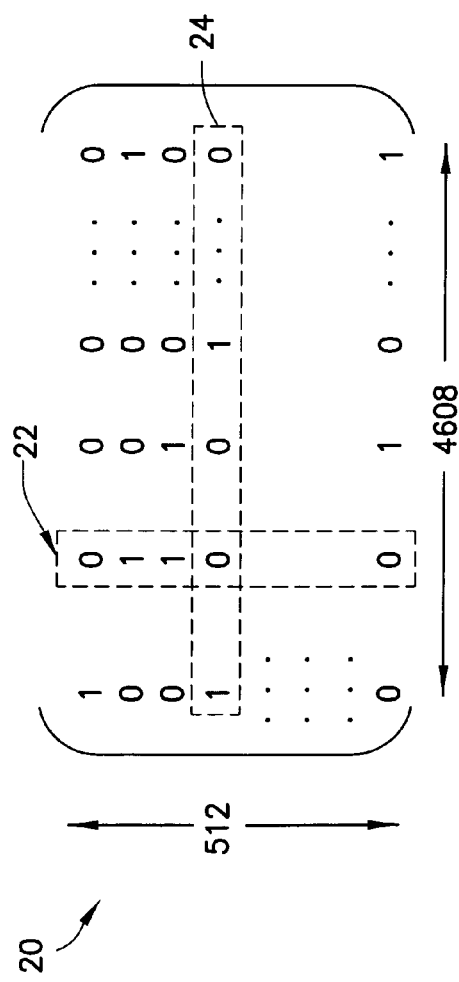
FIG. 1A is a matrix of an illustrative Low-Density Parity-Check mother code.
Figure 1B:
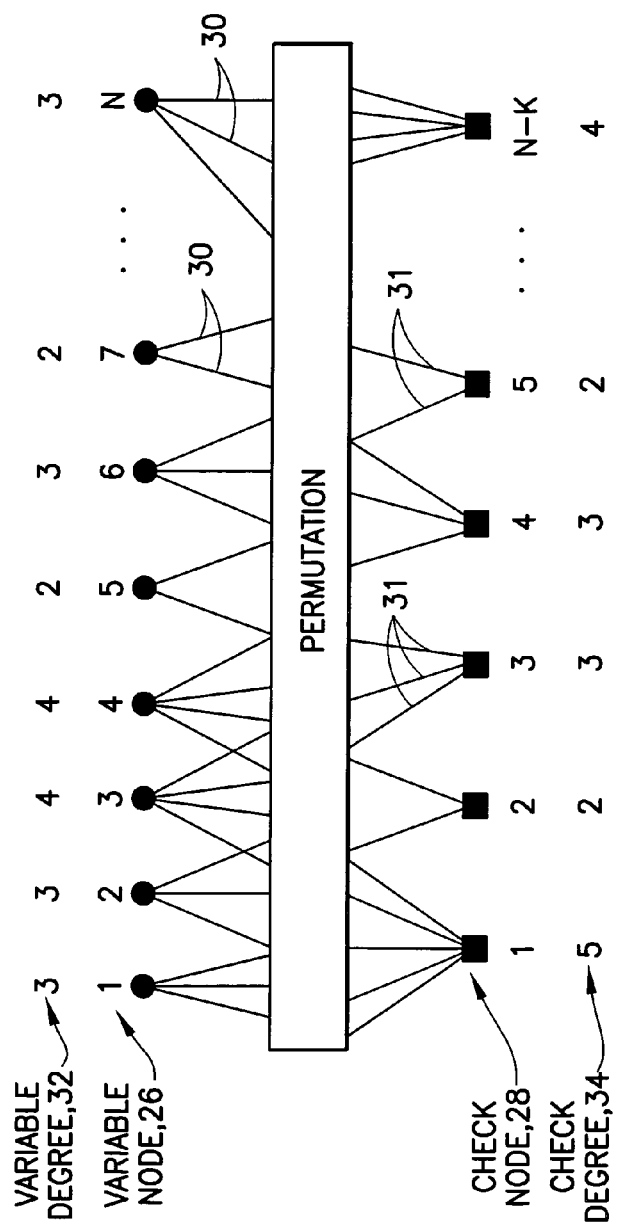
FIG. 1B is a bipartite graph depicting connections between variable and check nodes.

FIGS. 1A and 1B graphically describe an LDPC code. Note that FIGS. 1A, 1B and 2A, and the following discussion thereof, were presented in commonly-assigned U.S. Pat. No. 7,222,284. The parity-check matrix 20 of FIG. 1A is an example of a commonly used 512×4608 matrix, wherein each matrix column 22 corresponds to a codeword element (variable node of FIG. 1B) and each matrix row 24 corresponds to a parity-check equation (check node of FIG. 1B). If each column 22 of the matrix H includes exactly the same number m of non-zero elements, and each row 24 of the matrix H includes exactly the same number k of non-zero elements, the matrix 20 represents what is termed a regular LDPC code. If the code allows for non-uniform counts of non-zero elements among the columns 22 and/or rows 24, it is termed an irregular LDPC code.

Irregular LDPC codes have been shown to significantly outperform regular LDPC codes, which has generated renewed interest in this coding system since its inception decades ago. The bipartite graph of FIG. 1B illustrates that each codeword element (variable nodes 26) is connected only to parity-check equations (check nodes 28) and not directly to other codeword elements (and vice versa). Each connection, termed a variable edge 30 or a check edge 31 (each edge represented by a line in FIG. 1B), connects a variable node 26 to a check node 28 and represents a non-zero element in the parity-check matrix H. The number of variable edges 30 connected to a particular variable node 26 is termed its degree, and the number of variable degrees 32 are shown corresponding to the number of variable edges 30 emanating from each variable node 26. Similarly, the number of check edges 31 connected to a particular check node 28 is termed its degree, and the number of check degrees 34 are shown corresponding to the number of check edges 31 emanating from each check node 31. Since the degree 32, 34 represents non-zero elements of the matrix H, the bipartite graph of FIG. 1B represents an irregular LDPC code matrix. The following discussion is directed toward irregular LDPC codes since they are more complex and potentially more useful, but may also be applied to regular LDPC codes with normal skill in the art.

Figure 2A:
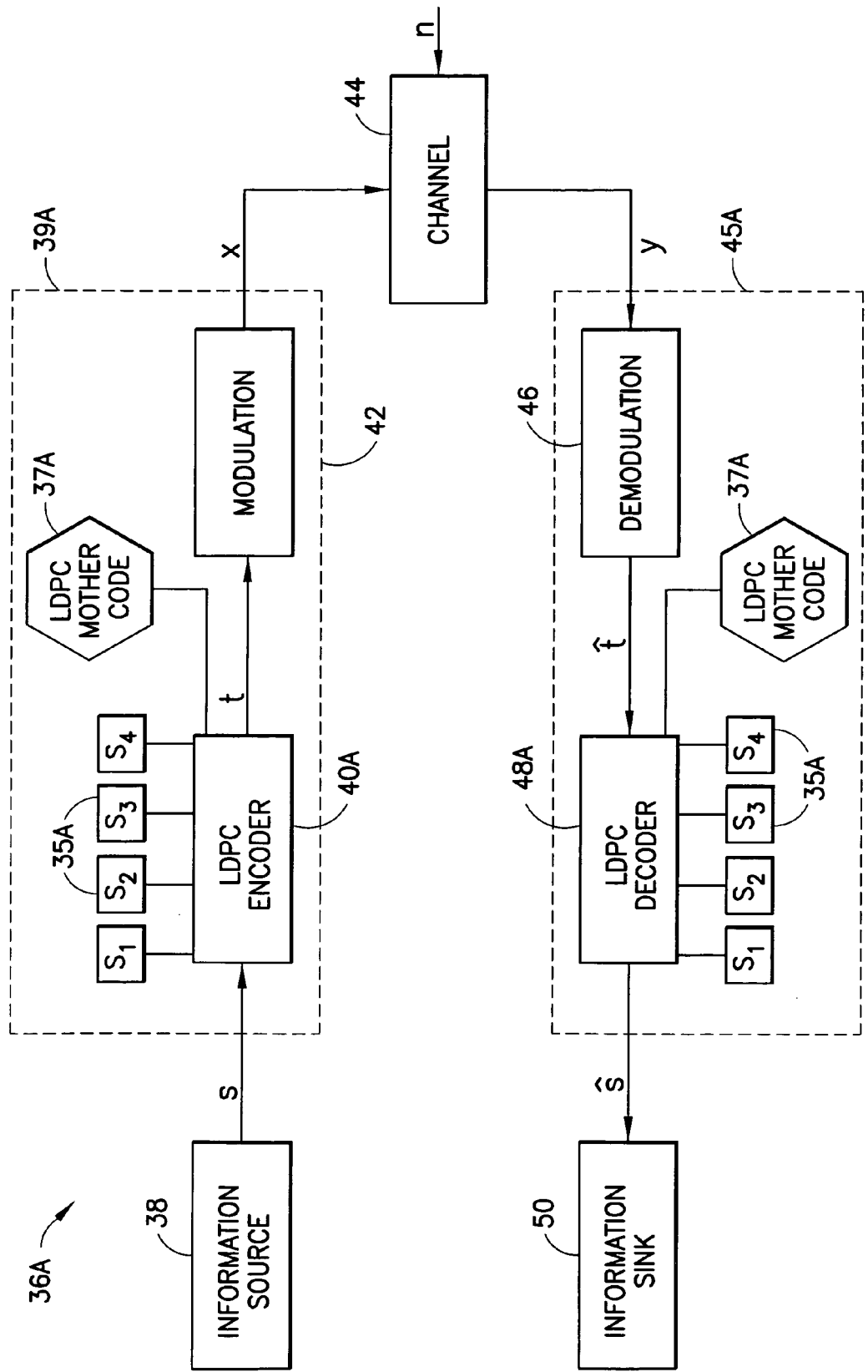
FIG. 2A is a logical block diagram showing operation of a discrete communication system using a LDPC coding scheme of multiple coding rates for its error control.

FIG. 2A is a logical block diagram showing operation of a discrete communication system 36A using a LDPC coding scheme of multiple coding rates for its error control. An information source 38 outputs a K dimensional sequence of information bits s into a transmitter 39A, the transmitter including at least an encoder 40A, a modulation block 42, and storage 35A, 37A. A LDPC encoder 40 encodes the sequence s into an N dimensional codeword t by accessing a stored LDPC mothercode 37A and one of several stored puncture sequences 35A, one puncture sequence corresponding to one code rate. The codeword t is broken up into sub-vectors, which are then modulated and up-converted at a modulation block 42 and transmitted as a vector x of the sub-vectors over one or more channels 44. Additive white Gaussian noise n is added at the channel and/or from system hardware, so that the vector y=x+n is input into a receiver 45A. The receiver 45A includes at least a demodulation block 46, a decoder 48A, and memory storage for the same LDPC mother code 37A and the same puncture sequences 35A used by the transmitter 39A. Since x and n are uncorrelated and the modulation is memoryless, the received vector y can be demodulated symbol-by-symbol at a demodulating block 46, producing a hard decision vector {umlaut over (t)} on the received information vector t. Probabilities of the decision being correct are also calculated at the demodulation block 46, and all this is input into a LDPC decoder 48A that iteratively decodes the entire received code block and outputs a decoded information vector S to an information sink 50.

Reference may be made to commonly-assigned U.S. Pat. No. 7,222,284 with regards to LDPCCs and, more specifically, puncture sequences for multiple code rates. Reference may also be made to U.S. Pat. No. 7,594,154 with regards to FEC. Further reference may be made to commonly-assigned U.S. Pat. No. 7,458,010 with regards to irregularly structured LDPCCs.

The use of the exemplary embodiments of this invention solves the problem of transmitting a coded signal that is robust to channels variations that packet communication systems such as, but not limited to, WLAN systems, may experience. This coded signaling approach allows for the receiver to decode the received signal with fewer errors than other existing WLAN FEC schemes. The use of the exemplary embodiments of this invention solves this problem for a data block of a rate ¾ with block length of 1296 bits, but is not limited for use with only this particular data rate and/or block length.

Conventional WLAN systems based on the 802.11 standard did not have an advanced coding option. As such, the use of the exemplary embodiments of this invention addresses the need to provide an advanced coding scheme, and may be employed to provide an advanced coding solution for 802.11.

The use of the exemplary embodiments of this invention provides in one aspect thereof a matrix prototype that defines the structured parity-check matrix and, ultimately, the LDPC FEC code. The use of the exemplary embodiments of this invention defines, in one non-limiting aspect thereof, a LDPC code of rate ¾ for the length of 1296 bits for the IEEE802.11n Standard. This particular code definition has good threshold performance and very low error floors. These features make this code a suitable solution for WLAN systems.

By way of introduction, the LDPCC encoder, in accordance with exemplary embodiments of this invention, is systematic, that is, it encodes an information block (I) of size k, where $I=(i_0, i_1, \ldots i_{(k-1)})$, into a codeword c of size n, where $c=(i_0, i_1, \ldots i_{(k-1)}, p_0, p_1, \ldots, p_{(n-k-1)})$, by adding n−k parity bits obtained so that $H \cdot c^T = 0$, where H is an (n−k)×n parity-check matrix.

The parity-check matrix H may be partitioned into square sub-blocks (that is, sub-matrices) of size Z×Z. These sub-matrices may be either cyclic-permutations of a given sub-matrix or null sub-matrices. A null sub-matrix is a Z×Z sub-matrix having 0 for all of its values. Preferably, and as illustrated below, the given sub-matrix is an identity sub-matrix. Although the exemplary embodiments presented below utilize cyclic-permutations of an identity sub-matrix, in other embodiments a permutation sub-matrix other than an identity sub-matrix may be used.

A cyclic-permutation sub-matrix $P_i$ is obtained from the given sub-matrix by cyclically shifting the columns of the given sub-matrix to the right by i elements. Note that the sub-matrix $P_0$ is the given sub-matrix. The following three matrices illustrate examples (for a sub-matrix size of 8×8, that is Z=8) of cyclic-permutation matrices $P_i$ where the given sub-matrix $P_0$ is the identity matrix:

$$P_0 = \begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix},$$

$$P_1 = \begin{bmatrix} 0 & 1 & 0 & 0 & 0 & 0 & 0 \\ 0 & 0 & 1 & 0 & 0 & 0 & 0 \\ 0 & 0 & 0 & 1 & 0 & 0 & 0 \\ 0 & 0 & 0 & 0 & 1 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 \end{bmatrix}, P_5 = \begin{bmatrix} 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \end{bmatrix}$$

As is apparent, the matrix $P_i$ is produced by cyclically shifting the columns of the identity matrix to the right by $i$ places.

Although the entire parity-check matrix H may be shown by displaying all of the elements that may then be partitioned into sub-matrices, as explained immediately above, instead it is generally preferable to represent the parity-check matrix H as a collection of shift values (i.e. shift indices). In such cases, the shift value representation of the parity-check matrix H may be used for encoding and/or decoding instead of the entire (i.e. actual) parity-check matrix H. Note that as referred to herein, no distinction will be made between the displaying the entire parity-check matrix and representing the parity-check matrix using the shift values. That is, the shift value representation may also be referred to as "the parity-check matrix." In the exemplary embodiments in which the shift value representation is used for encoding and/or decoding, the encoder and/or decoder may use the shift values directly with custom hardware without actually forming (i.e. generating) the entire parity-check matrix H, as a non-limiting example.

As a non-limiting example of the encoding and decoding process, consider a LDPCC encoder in a first device encoding an information block (I) having k=972 bits of information, where the information block is to be encoded in a first device, transmitted from the first device to a second device and decoded by the second device. The encoder in the first device receives the k bits of information as an input and encodes them to form a codeword c of size n=1296 bits. The encoder encodes according to the shift indices that specify a parity-check matrix H such that if H were to be constructed it would fulfill the relation $H \cdot c^T = 0$. Note that H is a matrix of dimensions $(n-k) \times n$.

The first device then transmits the codeword c, over some channel, to the second device. The second device receives a channel-corrupted version r of the codeword c. A decoder in the second device takes the received codeword r as an input and decodes the received codeword r using the shift indices that specify the parity-check matrix H. The decoder may produce an estimation c' of the transmitted codeword c, where the systematic portion of c' corresponds to an estimate of the transmitted K=972 information bits (in this case the first 972 bits of c'). In the decoding process, the decoder obtains the information block I or an estimation I' of the information block I. As referred to herein, the decoder obtaining the information block or information bits is understood to correspond to the decoder obtaining the information block or an estimation of the information block. Note that the decoder, in the process of decoding the received codeword, may extract the information bits from the received codeword or remove the parity bits from the received codeword, as non-limiting examples.

FIGS. 3-5 each represent an exemplary ¾ rate parity-check matrix for one of three different block lengths (N), 648 bits, 1296 bits and 1944 bits, respectively. Each of the represented parity-check matrices describes how to encode and decode different numbers of coded bits. In the parity-check matrices shown, each integer represents the shift value of a cyclically-shifted identity matrix for a sub-matrix of a certain size Z×Z, as explained above (i.e., see the above discussion concerning cyclic-permutation matrices, $P_i$). Thus, a shift value of 22 refers to $P_{22}$ and a shift value of 0 refers to $P_0$, the identity matrix for the sub-matrix. Furthermore, a "−" represents a null sub-matrix, that is, a Z×Z sub-matrix having 0 for all of its values.

Note that each of the ¾ rate parity-check matrices shown in FIGS. 3-5 has a different size Z×Z for its sub-matrices. That is, the parity-check matrix of FIG. 3 is for a block length (N) of 648 bits and has sub-matrices of size 27×27. The parity-check matrix of FIG. 4 is for a block length (N) of 1296 bits, representing 972 message bits, and has sub-matrices of size 54×54. The parity-check matrix of FIG. 5 is for a block length (N) of 1944 bits and has sub-matrices of size 81×81.

Also shown in FIGS. 3-5 is the signal to noise ratio (SNR, or bit/symbol energy to noise power spectral density, Eb/No dB) and the corresponding BLER for each parity-check matrix. The results shown in FIGS. 3-5 were obtained by simulations, using 50 iterations of standard BP in an AWGN channel model.

Note that in accordance with the exemplary embodiments of the invention, decoding may be accomplished using various methods and techniques known to one of ordinary skill in the art, including (but not limited to): layered belief propagation, parallel block belief propagation, min-sum decoding and variants of the above using extrinsic information scaling. The use of such decoding methods may provide various performance-implementation trade-offs.

Both the encoder and decoder may be assumed to have knowledge of specifics of the LDPC encoding process in accordance with the exemplary embodiments of this invention to properly convey a message across a channel. Note that other exemplary embodiments of this invention include all possible column permutations, all possible row permutations, and all possible column and row permutations.

Figure 6:
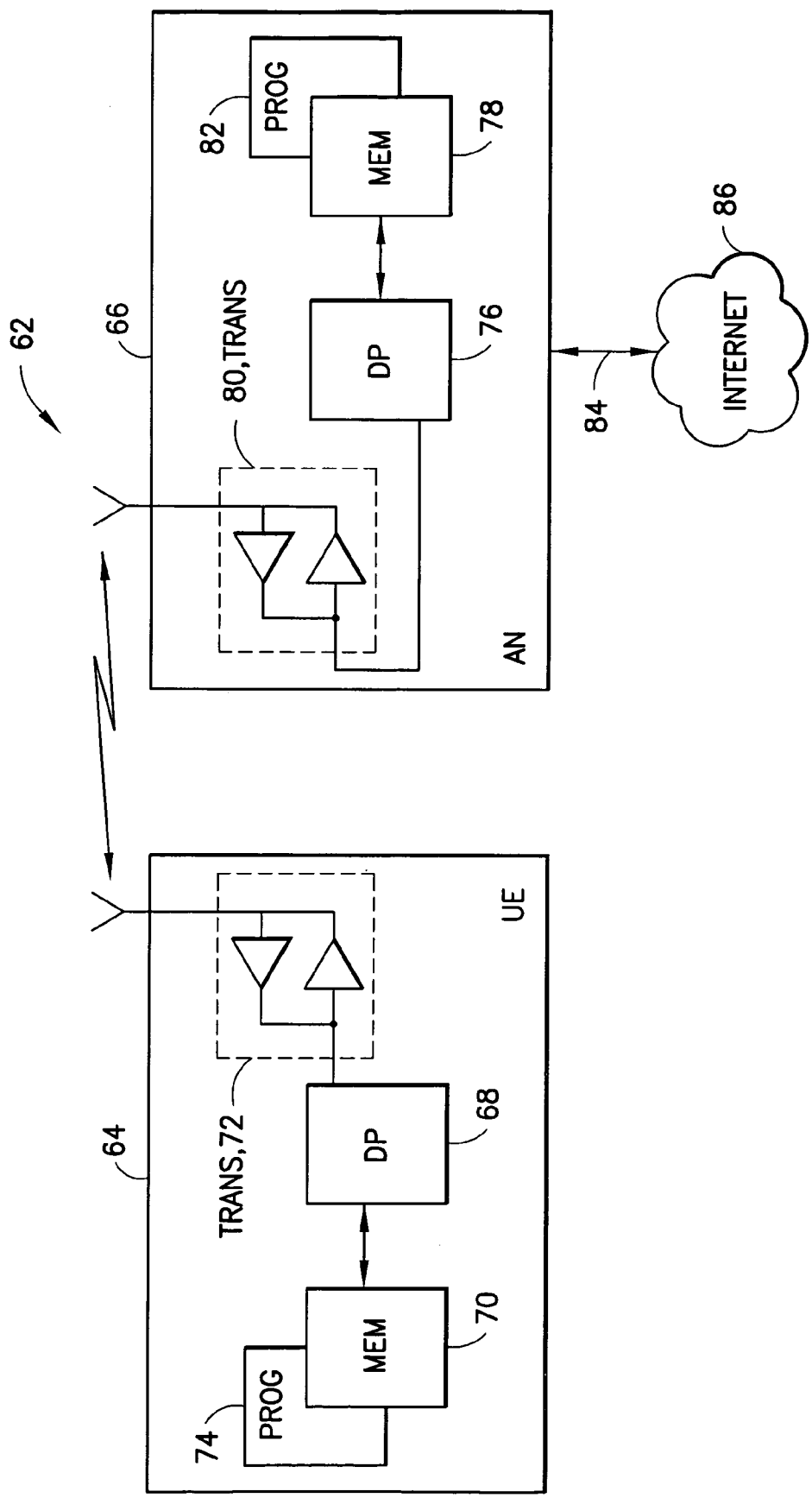
FIG. 6 illustrates a simplified block diagram of various electronic devices that are suitable for use in practicing the exemplary embodiments of this invention.

Reference is made to FIG. 6 for illustrating a simplified block diagram of various electronic devices that are suitable for use in practicing the exemplary embodiments of this invention. In FIG. 6, a wireless local area network (WLAN) 62 is adapted for communication with a user equipment (UE) 64 via a WLAN access node (AN) 66. The UE 64 includes a data processor (DP) 68, a memory (MEM) 70 coupled to the DP 68, and a suitable RF transceiver (TRANS) 72 (having a transmitter (TX) and a receiver (RX)) for bidirectional wireless communications with the WLAN AN 66. The MEM 70 stores a program (PROG) 74. Note that the TRANS 72 has at least one antenna to facilitate communication. The WLAN AN 66 includes a data processor (DP) 76, a memory (MEM) 78 coupled to the DP 76, and a suitable RF transceiver (TRANS) 80 (having a transmitter (TX) and a receiver (RX)) for bidirectional wireless communications with the UE 64. The MEM 78 stores a program (PROG) 82. Note that the TRANS 80 has at least one antenna to facilitate communication. The WLAN AN 66 is coupled via a data path 84 to one or more external networks or systems, such as the internet 86, for example.

Both of the PROGs 74, 82 are assumed to include program instructions that, when executed by the associated DP, enable the electronic device to operate in accordance with the exemplary embodiments of this invention, as discussed herein.

In general, the various embodiments of the UE 64 can include, but are not limited to, cellular telephones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The embodiments of this invention may be implemented by computer software executable by the DPs 68, 76 of the UE 64 and the WLAN AN 66, or by hardware, or by a combination of software and hardware.

The MEMs 70, 78 may be of any type suitable to the local technical environment and may be implemented using any suitable data storage technology, such as semiconductor-based memory devices, magnetic memory devices and systems, optical memory devices and systems, fixed memory and removable memory, as non-limiting examples. The DPs 68, 76 may be of any type suitable to the local technical environment, and may include one or more of general purpose computers, special purpose computers, microprocessors, digital signal processors (DSPs) and processors based on a multi-core processor architecture, as non-limiting examples.

Although illustrated in FIG. 6 as communicating with a WLAN AN 66, in accordance with the exemplary embodiments of the invention, the UE 64 may communicate, using a WLAN connection, with any other suitable electronic device.

Figure 7:
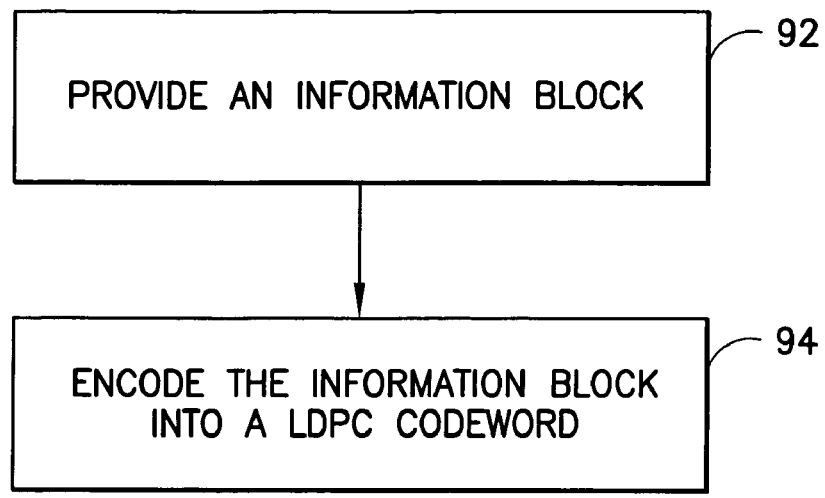
FIG. 7 depicts a flowchart illustrating one non-limiting example of a method for practicing the exemplary embodiments of this invention.

FIG. 7 depicts a flowchart illustrating one non-limiting example of a method for practicing the exemplary embodiments of this invention. The method includes: providing an information block of size k, $I=(i_0, i_1, \ldots i_{(k-1)})$ (step 92); and encoding the information block into a LDPC codeword c of size n, $c=(i_0, i_1, \ldots i_{(k-1)}, p_0, p_1, \ldots, p_{(n-k-1)})$, by adding n−k parity bits obtained so that $H \cdot c^T = 0$, where H is an (n−k)×n parity-check matrix (step 94).

In other embodiments, the parity-check matrix is partitioned into square sub-matrices of size Z×Z, with the sub-matrices being one of a cyclic-permutation of an identity matrix or a null sub-matrix, wherein a cyclic-permutation matrix $P_i$ is obtained from a Z×Z identity matrix by cyclically shifting the columns of the Z×Z identity matrix to the right by a shift value of i elements, where a null sub-matrix is a sub-matrix having 0 for all of its values.

In further exemplary embodiments, the parity-check matrix may be, or may be similar to, one of the parity-check matrices represented by FIG. 3, 4 or 5, as explained above.

Figure 8:
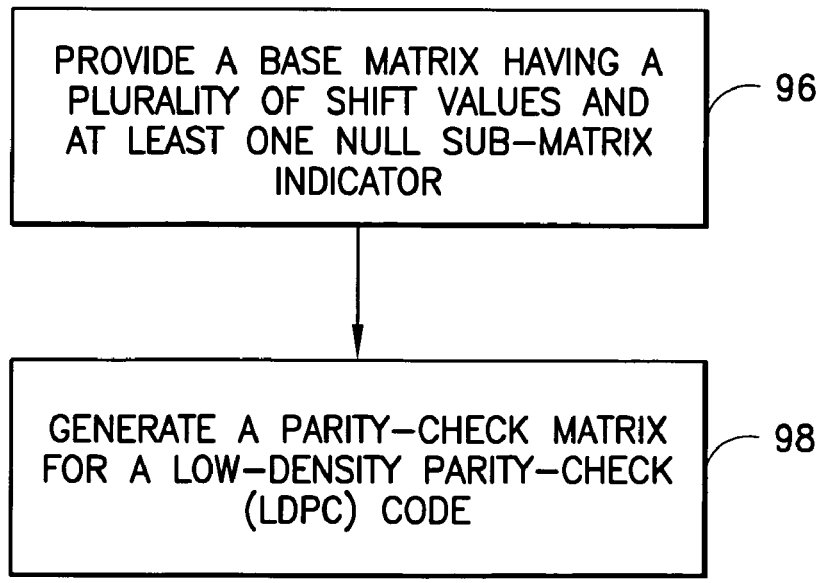
FIG. 8 depicts a flowchart illustrating another non-limiting example of a method for practicing the exemplary embodiments of this invention.

FIG. 8 depicts a flowchart illustrating another non-limiting example of a method for practicing the exemplary embodiments of this invention. The method includes: providing a base matrix having a plurality of shift values and at least one null sub-matrix indicator (step 96); and generating a parity-check matrix for a low-density parity-check (LDPC) code (step 98). Each shift value of the plurality of shift values represents a cyclic-permutation sub-matrix $P_i$ having a shift value of i, and each cyclic-permutation sub-matrix $P_i$ is obtained from a given sub-matrix of size Z×Z by cyclically shifting the columns of the given matrix to the right by a shift value of i elements. The at least one null sub-matrix indicator represents a null sub-matrix. The parity-check matrix is partitioned into square sub-matrices of size Z×Z, and the sub-matrices are one of a cyclic-permutation sub-matrix $P_i$ of the given sub-matrix or a null sub-matrix. Each shift value of the plurality of shift values and the at least one null sub-matrix indicator of the base matrix correspond to a different sub-matrix of the generated parity-check matrix.

In other embodiments, the method depicted in FIG. 8 may be employed for other block lengths of, for example, 648 and 1944 as shown in FIGS. 3 and 5, respectively. In further embodiments, the given sub-matrix may comprise a Z×Z identity sub-matrix.

In general, the various exemplary embodiments of this invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. In hardware, the invention may take the form of digital logic accessing memory storage banks, as a non-limiting example. In such an example, the implementer may chose to have the digital logic reside in an ASIC, FPGA or some other programmable digital device, as non-limiting examples. In software, the invention may take the form of object code derived from source code, as a non-limiting example. A processor would then execute the instructions described by the object code. Both hardware and software implementations may utilize the specific shift indices to encode and/or decode the codewords at the transmitter and/or receiver.

While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A method comprising:

Providing, by an apparatus, an information block (I) of size k, where $I=(i_0, i_1, \ldots i_{(k-1)})$; and encoding, by the apparatus, the information block into a low-density parity-check (LDPC) codeword c of size n, where $c=(i_0, i_1, \ldots i_{(k-1)}, p_0, p_1, \ldots, p_{(n-k-1)})$, by adding n−k parity bits obtained so that $H \cdot c^T = 0$, where H is an (n−k)×n parity-check matrix, wherein the parity-check matrix is partitioned into square sub-matrices of size Z×Z, wherein the sub-matrices comprise one of a cyclic-permutation of a given sub-matrix or a null sub-matrix, wherein a cyclic-permutation sub-matrix $P_i$ is obtained from the given sub-matrix by cyclically shifting the columns of the given sub-matrix to the right by a shift value of i elements, wherein a null sub-matrix comprises a sub-matrix having 0 for all of its values.

2. The method of claim 1, wherein the given sub-matrix comprises a Z×Z identity sub-matrix, wherein a code rate is ¾, wherein a block length of the LDPC codeword is 648 bits, wherein Z=27, wherein the parity-check matrix comprises:

```
22  3 25  6  3 13 11 10 -- 21 -- 13 --  2 -- 22 --  5  1  0 -- -- -- --
 8 13 23  2  7 15  4 -- 17 --  6 --  1 --  1 --  7 -- --  0  0 -- -- --
11  5 17 19 17  3 12  9 --  5 --  8 -- 10 -- 20 --  1 -- --  0  0 -- --
19 15  2  7  1 19 13 --  4 --  6 -- 13 -- 24 --  6 --  0 -- --  0  0 --
25 22 25  8 21 10 24  3 --  2 --  9 --  8 -- 16 --  6 -- -- -- --  0  0
14 25  6 23 15 16  7 -- 24 --  5 -- 16 --  6 --  2 --  1 -- -- -- --  0
``` wherein each number i of the parity-check matrix represents a cyclic-permutation sub-matrix having a shift value of i, wherein a sub-matrix of shift value 0 represents the Z×Z identity sub-matrix, wherein a sub-matrix of shift value—represents a null sub-matrix.

3. The method of claim 1, wherein the given sub-matrix comprises a Z×Z identity sub-matrix, wherein a code rate is ¾, wherein a block length of the LDPC codeword is 1296 bits, wherein Z=54, wherein the parity-check matrix comprises:

```
39 40 51 41  3 29  8 36 -- 14 --  6 -- 33 -- 11 --  4  1  0 -- -- -- --
48 21 47  9 48 35 51 -- 38 -- 28 -- 34 -- 50 -- 50 -- --  0  0 -- -- --
30 39 28 42 50 39  5 17 --  6 -- 18 -- 20 -- 15 -- 40 -- --  0  0 -- --
29  0  1 43 36 30 47 -- 49 -- 47 --  3 -- 35 -- 34 --  0 -- --  0  0 --
 1 32 11 23 10 44 12  7 -- 48 --  4 --  9 -- 17 -- 16 -- -- -- --  0  0
13  7 15 47 23 16 47 -- 43 -- 29 -- 52 --  2 -- 53 --  1 -- -- -- --  0
``` wherein each number i of the parity-check matrix represents a cyclic-permutation sub-matrix having a shift value of i, wherein a sub-matrix of shift value 0 represents the Z×Z identity sub-matrix, wherein a sub-matrix of shift value—represents a null sub-matrix.

4. The method of claim 1, wherein the given sub-matrix comprises a Z×Z identity sub-matrix, wherein a code rate is ¾, wherein a block length of the LDPC codeword is 1944 bits, wherein Z=81, wherein the parity-check matrix comprises:

```
74 57 64  2 77 60 24 25 -- 21 -- 36 -- 56 -- 19 -- 47  1  0 -- -- -- --
61 75 36 58 61 45 19 -- 50 -- 59 -- 29 -- 55 -- 71 -- --  0  0 -- -- --
71 18 27 39 77 28 37 48 --  6 -- 23 -- 14 -- 26 -- 29 -- --  0  0 -- --
27 15 18 28 65 78 22 -- 70 -- 47 -- 64 --  3 -- 49 --  0 -- --  0  0 --
59 45 51 17 61 63  6  6 -- 27 -- 45 -- 52 -- 55 -- 16 -- -- -- --  0  0
 8 14 41 77 59 14 31 -- 57 -- 58 --  3 -- 66 -- 22 --  1 -- -- -- --  0
``` wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

5. The method of claim 1, further comprising: generating the parity-check matrix for the LDPC code.

6. The method of claim 1, wherein the method is implemented by the apparatus within a wireless local area network.

7. A computer-readable medium tangibly storing program instructions execution of the program instructions resulting in operations comprising:
providing an information block (I) of size k, where I= $(i_0, i_1, \ldots i_{(k-1)})$; and
encoding the information block into a low-density parity-check (LDPC) codeword c of size n, where c=$(i_o, i_1, \ldots i_{(k-1)}, p_0, p_1, \ldots p_{(n-k-1)})$, by adding n−k parity bits obtained so that $H \cdot c^T = 0$, where H is an (n−k)×n parity-check matrix, wherein the parity-check matrix is partitioned into square sub-matrices of size Z×Z, wherein the sub-matrices comprise one of a cyclic-permutation of a given sub-matrix or a null sub-matrix, wherein a cyclic-permutation sub-matrix $P_i$ is obtained from the given sub-matrix by cyclically shifting the columns of the given sub-matrix to the right by a shift value of i elements, wherein a null sub-matrix comprises a sub-matrix having 0 for all of its values.

8. The computer-readable medium of claim 7, wherein the given sub-matrix comprises a Z×Z identity sub-matrix, wherein a code rate is ¾, wherein a block length of the LDPC codeword is 648 bits, wherein Z=27, wherein the parity-check matrix comprises:

| 22 | 3 | 25 | 6 | 3 | 13 | 11 | 10 | -- | 21 | -- | 13 | -- | 2 | -- | 22 | -- | 5 | 1 | 0 | -- | -- | -- | -- |
|----|---|----|---|---|----|----|----|----|----|----|----|----|---|----|----|----|---|---|---|----|----|----|----|
| 8 | 13 | 23 | 2 | 7 | 15 | 4 | -- | 17 | -- | 6 | -- | 1 | -- | 1 | -- | 7 | -- | -- | 0 | 0 | -- | -- | -- |
| 11 | 5 | 17 | 19 | 17 | 3 | 12 | 9 | -- | 5 | -- | 8 | -- | 10 | -- | 20 | -- | 1 | -- | -- | 0 | 0 | -- | -- |
| 19 | 15 | 2 | 7 | 1 | 19 | 13 | -- | 4 | -- | 6 | -- | 13 | -- | 24 | -- | 6 | -- | 0 | -- | -- | 0 | 0 | -- |
| 25 | 22 | 25 | 8 | 21 | 10 | 24 | 3 | -- | 2 | -- | 9 | -- | 8 | -- | 16 | -- | 6 | -- | -- | -- | -- | 0 | 0 |
| 14 | 25 | 6 | 23 | 15 | 16 | 7 | -- | 24 | -- | 5 | -- | 16 | -- | 6 | -- | 2 | -- | 1 | -- | -- | -- | -- | 0 | wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

9. The computer-readable medium of claim 7, wherein the given sub-matrix comprises a Z×Z identity sub-matrix, wherein a code rate is ¾, wherein a block length of the LDPC codeword is 1296 bits, wherein Z=54, wherein the parity-check matrix comprises:

| 39 | 40 | 51 | 41 | 3 | 29 | 8 | 36 | -- | 14 | -- | 6 | -- | 33 | -- | 11 | -- | 4 | 1 | 0 | -- | -- | -- | -- |
|----|----|----|----|---|----|---|----|----|----|----|---|----|----|----|----|----|---|---|---|----|----|----|----|
| 48 | 21 | 47 | 9 | 48 | 35 | 51 | -- | 38 | -- | 28 | -- | 34 | -- | 50 | -- | 50 | -- | -- | 0 | 0 | -- | -- | -- |
| 30 | 39 | 28 | 42 | 50 | 39 | 5 | 17 | -- | 6 | -- | 18 | -- | 20 | -- | 15 | -- | 40 | -- | -- | 0 | 0 | -- | -- |
| 29 | 0 | 1 | 43 | 36 | 30 | 47 | -- | 49 | -- | 47 | -- | 3 | -- | 35 | -- | 34 | -- | 0 | -- | -- | 0 | 0 | -- |
| 1 | 32 | 11 | 23 | 10 | 44 | 12 | 7 | -- | 48 | -- | 4 | -- | 9 | -- | 17 | -- | 16 | -- | -- | -- | -- | 0 | 0 |
| 13 | 7 | 15 | 47 | 23 | 16 | 47 | -- | 43 | -- | 29 | -- | 52 | -- | 2 | -- | 53 | -- | 1 | -- | -- | -- | -- | 0 | wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

10. The computer-readable medium of claim 7, wherein the given sub-matrix comprises a Z×Z identity sub-matrix, wherein a code rate is ¾, wherein a block length of the LDPC codeword is 1944 bits, wherein Z=81, wherein the parity-check matrix comprises:

| 74 | 57 | 64 | 2 | 77 | 60 | 24 | 25 | -- | 21 | -- | 36 | -- | 56 | -- | 19 | -- | 47 | 1 | 0 | -- | -- | -- | -- |
|----|----|----|---|----|----|----|----|----|----|----|----|----|----|----|----|----|----|---|---|----|----|----|----|
| 61 | 75 | 36 | 58 | 61 | 45 | 19 | -- | 50 | -- | 59 | -- | 29 | -- | 55 | -- | 71 | -- | -- | 0 | 0 | -- | -- | -- |
| 71 | 18 | 27 | 39 | 77 | 28 | 37 | 48 | -- | 6 | -- | 23 | -- | 14 | -- | 26 | -- | 29 | -- | -- | 0 | 0 | -- | -- |
| 27 | 15 | 18 | 28 | 65 | 78 | 22 | -- | 70 | -- | 47 | -- | 64 | -- | 3 | -- | 49 | -- | 0 | -- | -- | 0 | 0 | -- |
| 59 | 45 | 51 | 17 | 61 | 63 | 6 | 6 | -- | 27 | -- | 45 | -- | 52 | -- | 55 | -- | 16 | -- | -- | -- | -- | 0 | 0 |
| 8 | 14 | 41 | 77 | 59 | 14 | 31 | -- | 57 | -- | 58 | -- | 3 | -- | 66 | -- | 22 | -- | 1 | -- | -- | -- | -- | 0 | wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

11. The computer-readable medium of claim 7, execution of the program instructions resulting in operations further comprising transmitting the LDPC codeword from a first electronic device to a second electronic device.

12. The computer-readable medium of claim 11, wherein the first electronic device comprises the computer-readable medium storing the program instructions that perform the encoding of the information block into the LDPC codeword.

13. An apparatus comprising:
   at least one processor; and
   at least one memory including computer program instructions, the at least one memory and the computer program instructions being configured to, with the at least one processor, cause the apparatus at least to perform:
      providing an information block (I) of size k, where $I=(i_0, i_1, \ldots i_{(k-1)})$, and
      encoding the information block into a low-density parity-check (LDPC) codeword c of size n, where $c=(i_0, i_1, \ldots i_{(k-1)}, p_0, p_1, \ldots, p_{(n-k-1)})$, by adding n−k parity bits obtained so that $H \cdot c^T = 0$, where H is an (n−k)×n parity-check matrix, wherein the parity-check matrix is partitioned into square sub-matrices of size Z×Z, wherein the sub-matrices comprise one of a cyclic-permutation of a given sub-matrix or a null sub-matrix, wherein a cyclic-permutation sub-matrix $P_i$ is obtained from the given sub-matrix by cyclically shifting the columns of the given sub-matrix to the right by a shift value of i elements, wherein a null sub-matrix comprises a sub-matrix having 0 for all of its values.

14. The apparatus of claim 13, wherein the given sub-matrix comprises a Z×Z identity sub-matrix, wherein a code rate is ¾, wherein a block length of the LDPC codeword is 648 bits, wherein Z=27, wherein the parity-check matrix comprises:

| 22 | 3  | 25 | 6  | 3  | 13 | 11 | 10 | -- | 21 | -- | 13 | -- | 2  | -- | 22 | -- | 5  | 1  | 0  | -- | -- | -- | -- |
| 8  | 13 | 23 | 2  | 7  | 15 | 4  | -- | 17 | -- | 6  | -- | 1  | -- | 1  | -- | 7  | -- | -- | 0  | 0  | -- | -- | -- |
| 11 | 5  | 17 | 19 | 17 | 3  | 12 | 9  | -- | 5  | -- | 8  | -- | 10 | -- | 20 | -- | 1  | -- | -- | 0  | 0  | -- | -- |
| 19 | 15 | 2  | 7  | 1  | 19 | 13 | -- | 4  | -- | 6  | -- | 13 | -- | 24 | -- | 6  | -- | 0  | -- | -- | 0  | 0  | -- |
| 25 | 22 | 25 | 8  | 21 | 10 | 24 | 3  | -- | 2  | -- | 9  | -- | 8  | -- | 16 | -- | 6  | -- | -- | -- | -- | 0  | 0  |
| 14 | 25 | 6  | 23 | 15 | 16 | 7  | -- | 24 | -- | 5  | -- | 16 | -- | 6  | -- | 2  | -- | 1  | -- | -- | -- | -- | 0  | wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

15. The apparatus of claim 13, wherein the given sub-matrix comprises a Z×Z identity sub-matrix, wherein a code rate is ¾, wherein a block length of the LDPC codeword is 1296 bits, wherein Z=54, wherein the parity-check matrix comprises:

| 39 | 40 | 51 | 41 | 3  | 29 | 8  | 36 | -- | 14 | -- | 6  | -- | 33 | -- | 11 | -- | 4  | 1  | 0  | -- | -- | -- | -- |
| 48 | 21 | 47 | 9  | 48 | 35 | 51 | -- | 38 | -- | 28 | -- | 34 | -- | 50 | -- | 50 | -- | -- | 0  | 0  | -- | -- | -- |
| 30 | 39 | 28 | 42 | 50 | 39 | 5  | 17 | -- | 6  | -- | 18 | -- | 20 | -- | 15 | -- | 40 | -- | -- | 0  | 0  | -- | -- |
| 29 | 0  | 1  | 43 | 36 | 30 | 47 | -- | 49 | -- | 47 | -- | 3  | -- | 35 | -- | 34 | -- | 0  | -- | -- | 0  | 0  | -- |
| 1  | 32 | 11 | 23 | 10 | 44 | 12 | 7  | -- | 48 | -- | 4  | -- | 9  | -- | 17 | -- | 16 | -- | -- | -- | -- | 0  | 0  |
| 13 | 7  | 15 | 47 | 23 | 16 | 47 | -- | 43 | -- | 29 | -- | 52 | -- | 2  | -- | 53 | -- | 1  | -- | -- | -- | -- | 0  | wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

16. The apparatus of claim 13, wherein the given sub-matrix comprises a Z×Z identity sub-matrix, wherein a code rate is ¾, wherein a block length of the LDPC codeword is 1944 bits, wherein Z=81, wherein the parity-check matrix comprises:

| 74 | 57 | 64 | 2  | 77 | 60 | 24 | 25 | -- | 21 | -- | 36 | -- | 56 | -- | 19 | -- | 47 | 1 | 0  | -- | -- | -- | -- |
|----|----|----|----|----|----|----|----|----|----|----|----|----|----|----|----|----|----|---|----|----|----|----|----|
| 61 | 75 | 36 | 58 | 61 | 45 | 19 | -- | 50 | -- | 59 | -- | 29 | -- | 55 | -- | 71 | -- | -- | 0 | 0  | -- | -- | -- |
| 71 | 18 | 27 | 39 | 77 | 28 | 37 | 48 | -- | 6  | -- | 23 | -- | 14 | -- | 26 | -- | 29 | -- | -- | 0 | 0  | -- | -- |
| 27 | 15 | 18 | 28 | 65 | 78 | 22 | -- | 70 | -- | 47 | -- | 64 | -- | 3  | -- | 49 | -- | 0 | -- | -- | 0  | 0  | -- |
| 59 | 45 | 51 | 17 | 61 | 63 | 6  | 6  | -- | 27 | -- | 45 | -- | 52 | -- | 55 | -- | 16 | -- | -- | -- | -- | 0 | 0  |
| 8  | 14 | 41 | 77 | 59 | 14 | 31 | -- | 57 | -- | 58 | -- | 3  | -- | 66 | -- | 22 | -- | 1 | -- | -- | -- | -- | 0 | wherein each number i of the parity-check matrix represents a cyclic-permutation sub-matrix having a shift value of i, wherein a sub-matrix of shift value 0 represents the Z×Z identity sub-matrix, wherein a sub-matrix of shift value—represents a null sub-matrix.

17. The apparatus of claim 13, the at least one memory and the computer program instructions being configured to, with the at least one processor, cause the apparatus at least further perform:
 transmitting the LDPC codeword from the apparatus to a second electronic device; and
 dedecoding, using at least the parity-check matrix, a received LDPC codeword to obtain a corresponding information block.

18. The electronic device apparatus of claim 13, wherein the at least one data processor comprises an encoder.

19. The apparatus of claim 13, wherein the apparatus comprises a mobile electronic device.

20. The apparatus of claim 13, wherein the apparatus comprises a mobile telephone.

21. The apparatus of claim 13, wherein the apparatus comprises an integrated circuit.

22. The apparatus of claim 13, wherein the apparatus comprises a node of a wireless local area network.

23. The apparatus of claim 13, wherein the apparatus comprises a node of a wireless local area network using an IEEE 802.11n standard.

24. An apparatus comprising:
 at least one processor; and
 at least one memory including computer program instructions, the at least one memory and the computer program instructions being configured to, with the at least one processor, cause the apparatus at least to perform:
 receiving a low-density parity-check (LDPC) codeword c of size n, where $c=(i_0, i_1, \ldots, i_{(k-1)}, p_0, p_1, \ldots, p_{(n-k-1)})$, and
 decoding the LDPC codeword to obtain an information block (I) of size k, where $I=(i_0, i_1, \ldots, i_{(k-1)})$, by utilizing a (n−k)×n parity-check matrix H, where $H \cdot c^T = 0$, wherein the parity-check matrix is partitioned into square sub-matrices of size Z×Z, wherein the sub-matrices comprise one of a cyclic-permutation of a given sub-matrix or a null sub-matrix, wherein a cyclic-permutation sub-matrix $P_i$ is obtained from the given sub-matrix by cyclically shifting the columns of the given sub-matrix to the right by a shift value of i elements, wherein a null sub-matrix comprises a sub-matrix having 0 for all of its values.

25. The apparatus of claim 24, wherein the given sub-matrix comprises a Z×Z identity sub-matrix, wherein a code rate is ¾, wherein a block length of the LDPC codeword is 648 bits, wherein Z=27, wherein the parity-check matrix comprises:

| 22 | 3  | 25 | 6  | 3  | 13 | 11 | 10 | -- | 21 | -- | 13 | -- | 2  | -- | 22 | -- | 5  | 1 | 0  | -- | -- | -- | -- |
|----|----|----|----|----|----|----|----|----|----|----|----|----|----|----|----|----|----|---|----|----|----|----|----|
| 8  | 13 | 23 | 2  | 7  | 15 | 4  | -- | 17 | -- | 6  | -- | 1  | -- | 1  | -- | 7  | -- | -- | 0 | 0  | -- | -- | -- |
| 11 | 5  | 17 | 19 | 17 | 3  | 12 | 9  | -- | 5  | -- | 8  | -- | 10 | -- | 20 | -- | 1  | -- | -- | 0 | 0  | -- | -- |
| 19 | 15 | 2  | 7  | 1  | 19 | 13 | -- | 4  | -- | 6  | -- | 13 | -- | 24 | -- | 6  | -- | 0 | -- | -- | 0  | 0  | -- |
| 25 | 22 | 25 | 8  | 21 | 10 | 24 | 3  | -- | 2  | -- | 9  | -- | 8  | -- | 16 | -- | 6  | -- | -- | -- | -- | 0 | 0  |
| 14 | 25 | 6  | 23 | 15 | 16 | 7  | -- | 24 | -- | 5  | -- | 16 | -- | 6  | -- | 2  | -- | 1 | -- | -- | -- | -- | 0 | wherein each number i of the parity-check matrix represents a cyclic-permutation sub-matrix having a shift value of i, wherein a sub-matrix of shift value 0 represents the Z×Z identity sub-matrix, wherein a sub-matrix of shift value—represents a null sub-matrix.

26. The electronic device apparatus of claim 24, wherein the given sub-matrix comprises a Z×Z identity sub-matrix, wherein a code rate is ¾, wherein a block length of the LDPC codeword is 1296 bits, wherein Z=54, wherein the parity-check matrix comprises:

| 39 | 40 | 51 | 41 | 3  | 29 | 8  | 36 | -- | 14 | -- | 6  | -- | 33 | -- | 11 | -- | 4  | 1  | 0  | -- | -- | -- | -- |
|----|----|----|----|----|----|----|----|----|----|----|----|----|----|----|----|----|----|----|----|----|----|----|----|
| 48 | 21 | 47 | 9  | 48 | 35 | 51 | -- | 38 | -- | 28 | -- | 34 | -- | 50 | -- | 50 | -- | -- | 0  | 0  | -- | -- | -- |
| 30 | 39 | 28 | 42 | 50 | 39 | 5  | 17 | -- | 6  | -- | 18 | -- | 20 | -- | 15 | -- | 40 | -- | -- | 0  | 0  | -- | -- |
| 29 | 0  | 1  | 43 | 36 | 30 | 47 | -- | 49 | -- | 47 | -- | 3  | -- | 35 | -- | 34 | -- | 0  | -- | -- | 0  | 0  | -- |
| 1  | 32 | 11 | 23 | 10 | 44 | 12 | 7  | -- | 48 | -- | 4  | -- | 9  | -- | 17 | -- | 16 | -- | -- | -- | -- | 0  | 0  |
| 13 | 7  | 15 | 47 | 23 | 16 | 47 | -- | 43 | -- | 29 | -- | 52 | -- | 2  | -- | 53 | -- | 1  | -- | -- | -- | -- | 0  | wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

27. The apparatus of claim 24, wherein the given sub-matrix comprises a Z×Z identity sub-matrix, wherein a code rate is ¾, wherein a block length of the LDPC codeword is 1944 bits, wherein Z=81, wherein the parity-check matrix comprises:

| 74 | 57 | 64 | 2  | 77 | 60 | 24 | 25 | -- | 21 | -- | 36 | -- | 56 | -- | 19 | -- | 47 | 1  | 0  | -- | -- | -- | -- |
|----|----|----|----|----|----|----|----|----|----|----|----|----|----|----|----|----|----|----|----|----|----|----|----|
| 61 | 75 | 36 | 58 | 61 | 45 | 19 | -- | 50 | -- | 59 | -- | 29 | -- | 55 | -- | 71 | -- | -- | 0  | 0  | -- | -- | -- |
| 71 | 18 | 27 | 39 | 77 | 28 | 37 | 48 | -- | 6  | -- | 23 | -- | 14 | -- | 26 | -- | 29 | -- | -- | 0  | 0  | -- | -- |
| 27 | 15 | 18 | 28 | 65 | 78 | 22 | -- | 70 | -- | 47 | -- | 64 | -- | 3  | -- | 49 | -- | 0  | -- | -- | 0  | 0  | -- |
| 59 | 45 | 51 | 17 | 61 | 63 | 6  | 6  | -- | 27 | -- | 45 | -- | 52 | -- | 55 | -- | 16 | -- | -- | -- | -- | 0  | 0  |
| 8  | 14 | 41 | 77 | 59 | 14 | 31 | -- | 57 | -- | 58 | -- | 3  | -- | 66 | -- | 22 | -- | 1  | -- | -- | -- | -- | 0  | wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

28. The apparatus of claim 24, wherein the LDPC codeword is received from a second electronic device.

29. The apparatus of claim 24, wherein the apparatus comprises an integrated circuit.

30. The apparatus of claim 24, wherein the apparatus comprises a mobile electronic device.

31. The apparatus of claim 24, wherein the apparatus comprises a mobile telephone.

32. The apparatus of claim 24, wherein the apparatus comprises a node of a wireless local area network.

33. The apparatus of claim 24, wherein the apparatus comprises a node of a wireless local area network using an IEEE 802.11n standard.

34. A circuit comprising:
   an input configured to provide an information block (I) of size k,
   where $I=(i_0, i_1, \ldots i_{(k-1)})$; and
   encoder circuitry configured to encode the information block into a low-density parity-check (LDPC) codeword c of size n, where $c=(i_0, i_1, \ldots i_{(k-1)}, p_0, p_1, \ldots, p_{(n-k-1)})$, by adding n–k parity bits obtained so that $H \cdot c^T = 0$, where H is an (n–k)×n parity-check matrix, wherein the parity-check matrix is partitioned into square sub-matrices of size Z×Z, wherein the sub-matrices comprise one of a cyclic-permutation of a given sub-matrix or a null sub-matrix, wherein a cyclic-permutation sub-matrix $P_i$ is obtained from the given sub-matrix by cyclically shifting the columns of the given sub-matrix to the right by a shift value of i elements, wherein a null sub-matrix comprises a sub-matrix having 0 for all of its values.

35. The circuit of claim 34, wherein the given sub-matrix comprises a Z×Z identity sub-matrix, wherein a code rate is ¾, wherein a block length of the LDPC codeword is 648 bits, wherein Z=27, wherein the parity-check matrix comprises:

| 22 | 3  | 25 | 6  | 3  | 13 | 11 | 10 | -- | 21 | -- | 13 | -- | 2  | -- | 22 | -- | 5  | 1  | 0  | -- | -- | -- | -- |
|----|----|----|----|----|----|----|----|----|----|----|----|----|----|----|----|----|----|----|----|----|----|----|----|
| 8  | 13 | 23 | 2  | 7  | 15 | 4  | -- | 17 | -- | 6  | -- | 1  | -- | 1  | -- | 7  | -- | -- | 0  | 0  | -- | -- | -- |
| 11 | 5  | 17 | 19 | 17 | 3  | 12 | 9  | -- | 5  | -- | 8  | -- | 10 | -- | 20 | -- | 1  | -- | -- | 0  | 0  | -- | -- |
| 19 | 15 | 2  | 7  | 1  | 19 | 13 | -- | 4  | -- | 6  | -- | 13 | -- | 24 | -- | 6  | -- | 0  | -- | -- | 0  | 0  | -- |
| 25 | 22 | 25 | 8  | 21 | 10 | 24 | 3  | -- | 2  | -- | 9  | -- | 8  | -- | 16 | -- | 6  | -- | -- | -- | -- | 0  | 0  |
| 14 | 25 | 6  | 23 | 15 | 16 | 7  | -- | 24 | -- | 5  | -- | 16 | -- | 6  | -- | 2  | -- | 1  | -- | -- | -- | -- | 0  | wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

36. The circuit of claim 34, wherein the given sub-matrix comprises a Z×Z identity sub-matrix, wherein a code rate is ¾, wherein a block length of the LDPC codeword is 1296 bits, wherein Z=54, wherein the parity-check matrix comprises:

```
39 40 51 41  3 29  8 36 -- 14 --  6 -- 33 -- 11 --  4  1  0 -- -- -- --
48 21 47  9 48 35 51 -- 38 -- 28 -- 34 -- 50 -- 50 -- --  0  0 -- -- --
30 39 28 42 50 39  5 17 --  6 -- 18 -- 20 -- 15 -- 40 -- --  0  0 -- --
29  0  1 43 36 30 47 -- 49 -- 47 --  3 -- 35 -- 34 --  0 -- --  0  0 --
 1 32 11 23 10 44 12  7 -- 48 --  4 --  9 -- 17 -- 16 -- -- -- --  0  0
13  7 15 47 23 16 47 -- 43 -- 29 -- 52 --  2 -- 53 --  1 -- -- -- --  1
``` wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

37. The circuit of claim 34, wherein the given sub-matrix comprises a Z×Z identity sub-matrix, wherein a code rate is ¾, wherein a block length of the LDPC codeword is 1944 bits, wherein Z=81, wherein the parity-check matrix comprises:

```
74 57 64  2 77 60 24 25 -- 21 -- 36 -- 56 -- 19 -- 47  1  0 -- -- -- --
61 75 36 58 61 45 19 -- 50 -- 59 -- 29 -- 55 -- 71 -- --  0  0 -- -- --
71 18 27 39 77 28 37 48 --  6 -- 23 -- 14 -- 26 -- 29 -- --  0  0 -- --
27 15 18 28 65 78 22 -- 70 -- 47 -- 64 --  3 -- 49 --  0 -- --  0  0 --
59 45 51 17 61 63  6  6 -- 27 -- 45 -- 52 -- 55 -- 16 -- -- -- --  0  0
 8 14 41 77 59 14 31 -- 57 -- 58 --  3 -- 66 -- 22 --  1 -- -- -- --  0
``` wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

38. The circuit of claim 34, further comprising a transceiver, wherein the transceiver comprises the input.

39. The circuit of claim 38, further comprising: second circuitry adapted to transmit the LDPC codeword.

40. The circuit of claim 38, wherein the transceiver is operable to receive a LDPC codeword.

41. The circuit of claim 40, further comprising third circuitry adapted to decode, using at least the parity-check matrix, the received LDPC codeword to obtain a corresponding information block.

42. A circuit comprising:
an input configured to receive a low-density parity-check (LDPC) codeword c of size n, where c=($i_0$, $i_1$, ... $i_{(k-1)}$, $p_0$, $p_1$, ..., $p_{(n-k-1)}$); and decoder circuitry configured to decode the LDPC codeword into an information block (I) of size k, where I=($i_0$, $i_1$, ... $i_{(k-1)}$, by utilizing a (n−k)×n parity-check matrix H, where H·$c^T$=0, wherein the parity-check matrix is partitioned into square sub-matrices of size Z×Z, wherein the sub-matrices comprise one of a cyclic-permutation of a given sub-matrix or a null sub-matrix, wherein a cyclic-permutation sub-matrix $P_i$ is obtained from the given sub-matrix by cyclically shifting the columns of the given sub-matrix to the right by a shift value of i elements, wherein a null sub-matrix comprises a sub-matrix having 0 for all of its values.

43. The circuit of claim 42, wherein the given sub-matrix comprises a Z×Z identity sub-matrix, wherein a code rate is ¾, wherein a block length of the LDPC codeword is 648 bits, wherein Z=27, wherein the parity-check matrix comprises:

```
22  3 25  6  3 13 11 10 -- 21 -- 13 --  2 -- 22 --  5  1  0 -- -- -- --
 8 13 23  2  7 15  4 -- 17 --  6 --  1 --  1 --  7 -- --  0  0 -- -- --
11  5 17 19 17  3 12  9 --  5 --  8 -- 10 -- 20 --  1 -- --  0  0 -- --
19 15  2  7  1 19 13 --  4 --  6 -- 13 -- 24 --  6 --  0 -- --  0  0 --
25 22 25  8 21 10 24  3 --  2 --  9 --  8 -- 16 --  6 -- -- -- --  0  0
14 25  6 23 15 16  7 -- 24 --  5 -- 16 --  6 --  2 --  1 -- -- -- --  0
``` wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

44. The circuit of claim 42, wherein the given sub-matrix comprises a Z×Z identity sub-matrix, wherein a code rate is ¾, wherein a block length of the LDPC codeword is 1296 bits, wherein Z=54, wherein the parity-check matrix comprises:

```
39 40 51 41  3 29  8 36 -- 14 --  6 -- 33 -- 11 --  4  1  0 -- -- -- --
48 21 47  9 48 35 51 -- 38 -- 28 -- 34 -- 50 -- 50 -- --  0  0 -- -- --
30 39 28 42 50 39  5 17 --  6 -- 18 -- 20 -- 15 -- 40 -- --  0  0 -- --
29  0  1 43 36 30 47 -- 49 -- 47 --  3 -- 35 -- 34 --  0 -- --  0  0 --
 1 32 11 23 10 44 12  7 -- 48 --  4 --  9 -- 17 -- 16 -- -- -- --  0  0
13  7 15 47 23 16 47 -- 43 -- 29 -- 52 --  2 -- 53 --  1 -- -- -- --  0
``` wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

45. The circuit of claim 42, wherein the given sub-matrix comprises a Z×Z identity sub-matrix, wherein a code rate is ¾, wherein a block length of the LDPC codeword is 1944 bits, wherein Z=81, wherein the parity-check matrix comprises:

```
74 57 64  2 77 60 24 25 -- 21 -- 36 -- 56 -- 19 -- 47  1  0 -- -- -- --
61 75 36 58 61 45 19 -- 50 -- 59 -- 29 -- 55 -- 71 -- --  0  0 -- -- --
71 18 27 39 77 28 37 48 --  6 -- 23 -- 14 -- 26 -- 29 -- --  0  0 -- --
27 15 18 28 65 78 22 -- 70 -- 47 -- 64 --  3 -- 49 --  0 -- --  0  0 --
59 45 51 17 61 63  6  6 -- 27 -- 45 -- 52 -- 55 -- 16 -- -- -- --  0  0
 8 14 41 77 59 14 31 -- 57 -- 58 --  3 -- 66 -- 22 --  1 -- -- -- --  0
``` wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

46. The circuit of claim 42, further comprising a transceiver, wherein the transceiver comprises the input.

47. A method comprising:
receiving, by an apparatus, a low-density parity-check (LDPC) codeword c of size n, where c=($i_0$, $i_1$, . . . $i_{(k-1)}$, $p_0$, $p_1$, . . . , $p_{(n-k-1)}$); and
decoding, by the apparatus, the LDPC codeword into an information block (I) of size k, where I=($i_0$, $i_1$, . . . $i_{(k-1)}$), by utilizing a (n−k)×n parity-check matrix H, where $H \cdot c^T = 0$, wherein the parity-check matrix is partitioned into square sub-matrices of size Z×Z, wherein the sub-matrices comprise one of a cyclic-permutation of a given sub-matrix or a null sub-matrix, wherein a cyclic-permutation sub-matrix $P_i$ is obtained from the given sub-matrix by cyclically shifting the columns of the given sub-matrix to the right by a shift value of i elements, wherein a null sub-matrix comprises a sub-matrix having 0 for all of its values.

48. The method of claim 47, wherein the given sub-matrix comprises a Z×Z identity sub-matrix, wherein a code rate is ¾, wherein a block length of the LDPC codeword is 648 bits, wherein Z=27, wherein the parity-check matrix comprises:

```
22  3 25  6  3 13 11 10 -- 21 -- 13 --  2 -- 22 --  5  1  0 -- -- -- --
 8 13 23  2  7 15  4 -- 17 --  6 --  1 --  1 --  7 -- --  0  0 -- -- --
11  5 17 19 17  3 12  9 --  5 --  8 -- 10 -- 20 --  1 -- --  0  0 -- --
19 15  2  7  1 19 13 --  4 --  6 -- 13 -- 24 --  6 --  0 -- --  0  0 --
25 22 25  8 21 10 24  3 --  2 --  9 --  8 -- 16 --  6 -- -- -- --  0  0
14 25  6 23 15 16  7 -- 24 --  5 -- 16 --  6 --  2 --  1 -- -- -- --  0
``` wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

49. The method of claim 47, wherein the given sub-matrix comprises a Z×Z identity sub-matrix, wherein a code rate is ¾, wherein a block length of the LDPC codeword is 1296 bits, wherein Z=54, wherein the parity-check matrix comprises:

| 39 | 40 | 51 | 41 | 3  | 29 | 8  | 36 | -- | 14 | -- | 6  | -- | 33 | -- | 11 | -- | 4  | 1  | 0  | -- | -- | -- | -- |
| 48 | 21 | 47 | 9  | 48 | 35 | 51 | -- | 38 | -- | 28 | -- | 34 | -- | 50 | -- | 50 | -- | -- | 0  | 0  | -- | -- | -- |
| 30 | 39 | 28 | 42 | 50 | 39 | 5  | 17 | -- | 6  | -- | 18 | -- | 20 | -- | 15 | -- | 40 | -- | -- | 0  | 0  | -- | -- |
| 29 | 0  | 1  | 43 | 36 | 30 | 47 | -- | 49 | -- | 47 | -- | 3  | -- | 35 | -- | 34 | -- | 0  | -- | -- | 0  | 0  | -- |
| 1  | 32 | 11 | 23 | 10 | 44 | 12 | 7  | -- | 48 | -- | 4  | -- | 9  | -- | 17 | -- | 16 | -- | -- | -- | -- | 0  | 0  |
| 13 | 7  | 15 | 47 | 23 | 16 | 47 | -- | 43 | -- | 29 | -- | 52 | -- | 2  | -- | 53 | -- | 1  | -- | -- | -- | -- | 0  | wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

50. The method of claim 47, wherein the given sub-matrix comprises a Z×Z identity sub-matrix, wherein a code rate is ¾, wherein a block length of the LDPC codeword is 1944 bits, wherein Z=81, wherein the parity-check matrix comprises:

| 74 | 57 | 64 | 2  | 77 | 60 | 24 | 25 | -- | 21 | -- | 36 | -- | 56 | -- | 19 | -- | 47 | 1  | 0  | -- | -- | -- | -- |
| 61 | 75 | 36 | 58 | 61 | 45 | 19 | -- | 50 | -- | 59 | -- | 29 | -- | 55 | -- | 71 | -- | -- | 0  | 0  | -- | -- | -- |
| 71 | 18 | 27 | 39 | 77 | 28 | 37 | 48 | -- | 6  | -- | 23 | -- | 14 | -- | 26 | -- | 29 | -- | -- | 0  | 0  | -- | -- |
| 27 | 15 | 18 | 28 | 65 | 78 | 22 | -- | 70 | -- | 47 | -- | 64 | -- | 3  | -- | 49 | -- | 0  | -- | -- | 0  | 0  | -- |
| 59 | 45 | 51 | 17 | 61 | 63 | 6  | 6  | -- | 27 | -- | 45 | -- | 52 | -- | 55 | -- | 16 | -- | -- | -- | -- | 0  | 0  |
| 8  | 14 | 41 | 77 | 59 | 14 | 31 | -- | 57 | -- | 58 | -- | 3  | -- | 66 | -- | 22 | -- | 1  | -- | -- | -- | -- | 0  | wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

51. The method of claim 47, wherein the method is implemented by the apparatus within a wireless local area network.

52. A computer-readable medium tangibly storing program instructions, execution of the program instructions resulting in operations comprising:

receiving a low-density parity-check (LDPC) codeword c of size n, where $c=(i_0, i_1, \ldots i_{(k-1)}, p_0, p_1, \ldots, P_{(n-k-1)})$; and decoding the LDPC codeword into an information block (I) of size k, where $I=(i_0, i_1, \ldots i_{(k-1)})$, by utilizing a (n−k)×n parity-check matrix H, where $H \cdot c^T = 0$, wherein the parity-check matrix is partitioned into square sub-matrices of size Z×Z, wherein the sub-matrices comprise one of a cyclic-permutation of a given sub-matrix or a null sub-matrix, wherein a cyclic-permutation sub-matrix $P_i$ is obtained from the given sub-matrix by cyclically shifting the columns of the given sub-matrix to the right by a shift value of i elements, wherein a null sub-matrix comprises a sub-matrix having 0 for all of its values.

53. The computer-readable medium of claim 52, wherein the given sub-matrix comprises a Z×Z identity sub-matrix, wherein a code rate is ¾, wherein a block length of the LDPC codeword is 648 bits, wherein Z=27, wherein the parity-check matrix comprises:

| 22 | 3  | 25 | 6  | 3  | 13 | 11 | 10 | -- | 21 | -- | 13 | -- | 2  | -- | 22 | -- | 5  | 1  | 0  | -- | -- | -- | -- |
| 8  | 13 | 23 | 2  | 7  | 15 | 4  | -- | 17 | -- | 6  | -- | 1  | -- | 1  | -- | 7  | -- | -- | 0  | 0  | -- | -- | -- |
| 11 | 5  | 17 | 19 | 17 | 3  | 12 | 9  | -- | 5  | -- | 8  | -- | 10 | -- | 20 | -- | 1  | -- | -- | 0  | 0  | -- | -- |
| 19 | 15 | 2  | 7  | 1  | 19 | 13 | -- | 4  | -- | 6  | -- | 13 | -- | 24 | -- | 6  | -- | 0  | -- | -- | 0  | 0  | -- |
| 25 | 22 | 25 | 8  | 21 | 10 | 24 | 3  | -- | 2  | -- | 9  | -- | 8  | -- | 16 | -- | 6  | -- | -- | -- | -- | 0  | 0  |
| 14 | 25 | 6  | 23 | 15 | 16 | 7  | -- | 24 | -- | 5  | -- | 16 | -- | 6  | -- | 2  | -- | 1  | -- | -- | -- | -- | 0  | wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

54. The computer-readable medium of claim 52, wherein the given sub-matrix comprises a Z×Z identity sub-matrix, wherein a code rate is ¾, wherein a block length of the LDPC codeword is 1296 bits, wherein Z=54, wherein the parity-check matrix comprises:

| 39 | 40 | 51 | 41 | 3 | 29 | 8 | 36 | -- | 14 | -- | 6 | -- | 33 | -- | 11 | -- | 4 | 1 | 0 | -- | -- | -- | -- |
|---|---|---|---|---|---|---|---|---|---|---|---|---|---|---|---|---|---|---|---|---|---|---|---|
| 48 | 21 | 47 | 9 | 48 | 35 | 51 | -- | 38 | -- | 28 | -- | 34 | -- | 50 | -- | 50 | -- | -- | 0 | 0 | -- | -- | -- |
| 30 | 39 | 28 | 42 | 50 | 39 | 5 | 17 | -- | 6 | -- | 18 | -- | 20 | -- | 15 | -- | 40 | -- | -- | 0 | 0 | -- | -- |
| 29 | 0 | 1 | 43 | 36 | 30 | 47 | -- | 49 | -- | 47 | -- | 3 | -- | 35 | -- | 34 | -- | 0 | -- | -- | 0 | 0 | -- |
| 1 | 32 | 11 | 23 | 10 | 44 | 12 | 7 | -- | 48 | -- | 4 | -- | 9 | -- | 17 | -- | 16 | -- | -- | -- | -- | 0 | 0 |
| 13 | 7 | 15 | 47 | 23 | 16 | 47 | -- | 43 | -- | 29 | -- | 52 | -- | 2 | -- | 53 | -- | 1 | -- | -- | -- | -- | 0 | wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

55. The computer-readable medium of claim 52, wherein the given sub-matrix comprises a Z×Z identity sub-matrix, wherein a code rate is ¾, wherein a block length of the LDPC codeword is 1944 bits, wherein Z=81, wherein the parity-check matrix comprises:

| 74 | 57 | 64 | 2 | 77 | 60 | 24 | 25 | -- | 21 | -- | 36 | -- | 56 | -- | 19 | -- | 47 | 1 | 0 | -- | -- | -- | -- |
|---|---|---|---|---|---|---|---|---|---|---|---|---|---|---|---|---|---|---|---|---|---|---|---|
| 61 | 75 | 36 | 58 | 61 | 45 | 19 | -- | 50 | -- | 59 | -- | 29 | -- | 55 | -- | 71 | -- | -- | 0 | 0 | -- | -- | -- |
| 71 | 18 | 27 | 39 | 77 | 28 | 37 | 48 | -- | 6 | -- | 23 | -- | 14 | -- | 26 | -- | 29 | -- | -- | 0 | 0 | -- | -- |
| 27 | 15 | 18 | 28 | 65 | 78 | 22 | -- | 70 | -- | 47 | -- | 64 | -- | 3 | -- | 49 | -- | 0 | -- | -- | 0 | 0 | -- |
| 59 | 45 | 51 | 17 | 61 | 63 | 6 | 6 | -- | 27 | -- | 45 | -- | 52 | -- | 55 | -- | 16 | -- | -- | -- | -- | 0 | 0 |
| 8 | 14 | 41 | 77 | 59 | 14 | 31 | -- | 57 | -- | 58 | -- | 3 | -- | 66 | -- | 22 | -- | 1 | -- | -- | -- | -- | 0 | wherein each number i of the parity-check matrix represents a cyclic-permutation sub-matrix having a shift value of i, wherein a sub-matrix of shift value 0 represents the Z×Z identity sub-matrix, wherein a sub-matrix of shift value— represents a null sub-matrix.

\* \* \* \* \*